United States Patent
Landschuetz et al.

(10) Patent No.: US 9,354,289 B2
(45) Date of Patent: May 31, 2016

(54) METHOD AND MAGNETIC RESONANCE APPARATUS TO REDUCE MOVEMENT ARTIFACTS IN MAGNETIC RESONANCE IMAGES

(71) Applicants: Wilfried Landschuetz, Baiersdorf (DE); Peter Speier, Erlangen (DE)

(72) Inventors: Wilfried Landschuetz, Baiersdorf (DE); Peter Speier, Erlangen (DE)

(73) Assignee: Siemens Aktiengellschaft, Munich (DE)

( * ) Notice: Subject to any disclaimer, the term of this patent is extended or adjusted under 35 U.S.C. 154(b) by 411 days.

(21) Appl. No.: 13/940,447

(22) Filed: Jul. 12, 2013

(65) Prior Publication Data

US 2014/0015528 A1    Jan. 16, 2014

(30) Foreign Application Priority Data

Jul. 12, 2012    (DE) .......................... 10 2012 212 198

(51) Int. Cl.
*G01V 3/00* (2006.01)
*G01R 33/565* (2006.01)
*G01R 33/3415* (2006.01)

(52) U.S. Cl.
CPC ...... *G01R 33/56509* (2013.01); *G01R 33/3415* (2013.01)

(58) Field of Classification Search
USPC .......................................................... 324/309
See application file for complete search history.

(56) References Cited

U.S. PATENT DOCUMENTS

| | | | |
|---|---|---|---|
| 4,825,162 A | 4/1989 | Roemer et al. | |
| 5,208,534 A | 5/1993 | Okamoto et al. | |
| 7,495,437 B2 | 2/2009 | Griswold et al. | |
| 2005/0264287 A1 | 12/2005 | Griswold et al. | |
| 2009/0286478 A1* | 11/2009 | Biber | G01R 33/3607 455/41.2 |
| 2010/0225317 A1 | 9/2010 | Biber | |
| 2012/0243756 A1* | 9/2012 | Samsonov | G01R 33/56509 382/131 |
| 2013/0038327 A1* | 2/2013 | Fautz | G01R 33/4833 324/309 |
| 2014/0126796 A1* | 5/2014 | Chesneau | G01R 33/4824 382/131 |
| 2015/0123659 A1* | 5/2015 | Weingartner | A61B 5/055 324/309 |

(Continued)

FOREIGN PATENT DOCUMENTS

JP    2003325476 A    11/2003
JP    2004283436 A    10/2004

OTHER PUBLICATIONS

Zhang et al; "Simulation of Three-dimensional Positioning for Multi-target Using Life-detection Radar Based on Inverted T-shaped Antenna Aray"; Chinese Medical Equipment Journal; vol. 11; No. 3; pp. 6-8; (2012).

(Continued)

*Primary Examiner* — Rodney Fuller
(74) *Attorney, Agent, or Firm* — Schiff Hardin LLP

(57) ABSTRACT

In a method and apparatus to reduce movement artifacts in magnetic resonance images an essentially unmoving area of a region to be imaged is located in a region of high sensitivity of a first group of individual local antennas, and a moving area is located in the region of high sensitivity of a second group of local antennas. Spatially coded magnetic resonance signals are received by a first group of the local antennas and are individually processed further. Spatially coded nuclear magnetic resonance signals are received by the second group of local antennas and are combined with a weighting, using weighting factors. The weighting factors are determined so as to reduce gradient of the weighted, combined, spatially dependent sensitivity of the local antennas of the second group.

8 Claims, 2 Drawing Sheets

(56) References Cited

U.S. PATENT DOCUMENTS

2015/0161789 A1* 6/2015 Roujol ............... G06K 9/6215
382/131
2015/0316635 A1* 11/2015 Stehning .......... G01R 33/56341
324/307

OTHER PUBLICATIONS

Liu et al; "Magnetic Resonance Imaging Artifact Generating Mechanism and Solution Research"; Clinical Engineering; vol. 26; No. 10; pp. 114-117; (2011).

* cited by examiner

METHOD AND MAGNETIC RESONANCE APPARATUS TO REDUCE MOVEMENT ARTIFACTS IN MAGNETIC RESONANCE IMAGES

BACKGROUND OF THE INVENTION

1. Field of the Invention

The invention concerns a method to reduce movement artifacts in magnetic resonance images, as well as a magnetic resonance apparatus to implement the method.

2. Description of the Prior Art

Magnetic resonance imaging of the heart presents a particular difficulty that must be overcome, because cardiac movement is still overlaid by the breathing movement. In order to reduce artifacts due to the cardiac movement, segmented acquisition techniques are used. The patient is additionally required to hold his or her breath during the data acquisition. The required breath-hold times are in the range of 20 seconds. Particularly for cardiac patients, it is often not possible for the patient to hold his or her breath for such a long period of time. This leads to inconsistent raw data (k-space data) in segmented acquisitions. The reconstructed images then have artifacts that prevent a clinical interpretation. Depending on the k-space sampling scheme or reordering scheme, the artifacts in the image manifest in the phase coding direction as "ghosting" or even as "blurring/ringing" at the boundaries of contrast jumps. In applications in which a transient contrast ratio is imaged, the discrete ghost structures can superimpose further distant structures. For example, this occurs in morphological images that were acquired with a "dark blood" turbo spin echo technique. Even in the case of exposures in which small contrast changes in a transient contrast ratio are diagnostically important—for example activity examinations with "Late Gadolinium Enhancement" or edema imaging with T2 contrast—movement artifacts prevent a reliable diagnosis. The aforementioned two imaging techniques are the most common clinical cardiac examinations and must therefore be designed to be as robust as possible.

In order to avoid the movement artifacts described above, which are due to an insufficient breath-hold length of time during the data acquisition, the acquisitions are (for example) repeated until image data without movement artifacts are present. Unsegmented image data are also generated, but must have a lower quality than the segmented image data.

In the data acquisition, cushions are also used that increase the clearance of the local antennas from the imaging area. However, this is also at the cost of the signal-to-noise ratio, and therefore of the image quality.

To improve the image quality, coil arrays are increasingly used that have a high signal-to-noise ratio. 32 to 128 channels are the state of the art. The local antennas required for measurement are connected with the signal processing channels of the magnetic resonance apparatus by means of a hardware switching matrix, or also purely electronically. The received nuclear magnetic resonance signals from multiple local antennas can thereby be combined for the purpose of reducing the required reception channels.

A method for digital channel reduction in MR reception systems is described in E 10 2009 012 109 A1 (corresponding to US 2010/0225317 A1). The weighting factors that are required for combination are determined with low resolution from a preceding measurement. The resulting combination is designated therein as an expanded software version of an already known hardware mode matrix. The method described therein allows a reduction of the number of channels, while still achieving an optimal signal-to-noise ratio in a selected imaging region. The imaging region can be predetermined either by a user, or automatically.

DE 690 25 513 T2 concerns an arrangement for image generation by means of magnetic resonance, wherein a fast measurement of dynamic processes should take place given a high signal-to-noise ratio. For this purpose, a number of surface coils is used that can simultaneously acquire magnetic resonance signals. The magnetic resonance system described therein also has an aliasing integration device and a compositing or synthesizing device in order to produce a weighting/additive processing of the acquired magnetic resonance signals, so as to combine the multiple acquired magnetic resonance signals. The image data of all surface coils are pixel-by-pixel in order to obtain a single final image. The signal readout in this known procedure can take place with a time offset within a scan interval if there is a low correlation between the surface coils.

U.S. Pat. No. 4,825,162 discloses a method in order to simultaneously obtain a different magnetic resonance response signal from each of a number of surface coils arranged near one another. Each of these magnetic resonance response signals is combined with a separate image of the sample, which are then in turn combined point for point in order to obtain a single composite magnetic resonance image of the entire sample. It is assumed that the surface coils have no interaction among one another whatsoever. In the image reconstruction, the individual images are combined with a weighting such that a target function is maximized in order to obtain an improved SNR of the entire reconstruction image.

These two publications thus concern the reconstruction of the entire magnetic resonance image from the data of all local antennas.

SUMMARY OF THE INVENTION

An object of the present invention is to provide a method and an apparatus to reduce movement artifacts in magnetic resonance images, wherein the spatially coded magnetic resonance signals are received by individual local antennas.

The method according to the invention to reduce movement artifacts in magnetic resonance images uses a first group and a second group of individual local antennas, with an essentially unmoving area of a region to be imaged being located in a region of high sensitivity of the first group of individual local antennas, and a moving area of the region is to be imaged is located in the region of high sensitivity of the second group of local antennas. In the method according to the invention, spatially coded magnetic resonance signals that are received by the first group of local antennas are individually processed further, and spatially coded magnetic resonance signals that are received by the second group of local antennas are combined with a weighting by weighting factors. The weighting factors are determined so that a gradient of the weighted, combined, spatially dependent sensitivity of the local antennas is reduced.

The device according to the invention concerns a magnetic resonance apparatus with a first group and a second group of individual local antennas; and a signal processing unit, connected with the second group of local antennas, that is designed to combine spatially coded nuclear magnetic resonance signals received by the second group of local antennas so that a gradient of the weighted, combined, spatially dependent sensitivity of the second group of local antennas is reduced.

The reduction of the gradient of the combined, spatially dependent sensitivity of the local antennas takes place in comparison to the gradient of the spatially dependent sensitivity of the individual local antennas. The reduction of the gradient of the sensitivity is equivalent to a homogenization or even a flattening of the sensitivity profile.

The invention is based on the insight that the sharp gradient in the sensitivity at a single local antenna in a reception coil array with high local antenna density is the cause of the relative intensity of the artifacts described above, such as "ghosting" or "blurring/ringing". The artifacts become stronger the higher the local coil density in an antenna array. A high local coil density is equivalent to a reduction of the individual local antennas. The sensitivity is very high in the immediate proximity of the local antenna and then decreases with increasing distance from the local antenna, which is equivalent to a strong gradient. Moving subjects are imaged as ghost images in a phase coding. Since these ghost images originate from regions with high sensitivity, they have a high intensity in other regions of the image where the sensitivity is lower, such that the relative artifact amplitude is higher the stronger the sensitivity gradient.

The fundamental basis to avoid such artifacts is to virtually connect multiple small, individual local antennas into a larger local antenna with a more homogenous sensitivity profile. The imaging area near the local antennas is therefore also no longer excessively detected in terms of its signal, so the artifacts are significantly reduced. The virtual connection or combination of the signals of the local antennas to be combined takes place by means of weighting factors, with the weighting factors determined such that the gradient of the sensitivity is reduced. The weighting factors are thereby specific to the local antennas, thus fixed for each local antenna.

A combination of the local antennas that is advantageous for these purposes is provided by (for example) the modeling of a CP mode (circularly polarized local antenna), for example as is described in the DE 10 2009 012 109 A1 (cited above). Differing therefrom, however, in accordance with the invention the combination takes place only for the group of local antennas in whose sensitivity or imaging region are situated moving areas in the region to be imaged. The group of local antennas in whose sensitivity or imaging region only unmoving areas are situated are not combined. Here, "essentially unmoving" means that movement artifacts that may possibly be present from this area do not negatively affect a reliable diagnosis.

The aforementioned combination can already take place in k-space, meaning that the magnetic resonance signals that are present in k-space are combined before they are transformed back into the spatial domain. For example, the combination can take place line by line in k-space.

Generally stated, the weighted combination in accordance with the invention of only a portion of the magnetic resonance signals that are selected using the movement in the sensitivity region (thus the nuclear magnetic resonance signals of the first group) ultimately takes place before all magnetic resonance signals (that is the unprocessed or raw magnetic resonance signals of the second group of local antennas and the result of the combination) are combined in order to reconstruct a complete image or a complete image data set of the region to be imaged.

An advantageous combination including the weighting factors is achieved using cost function that is optimized for an optimally uniform signal intensity.

This corresponds to an optimization of the gradient field of the sensitivity up to an acceptable gradient (target gradient) that lies between the existing intensity gradients and a uniform signal intensity.

As already mentioned, the combination is implemented only with the group of local antennas that lie near moving regions or subjects. In the case of the breathing movement, in general the local antennas that are placed on the upper body of the patient are also themselves moved. The local antennas to be combined can thus already be identified from the known arrangement on the patient.

In an embodiment of the invention, spatially coded magnetic resonance signals that were themselves received with the local antennas are used to determine the weighting factors. This method can use signals from a prescan, or from the measurement itself. The linear combination results from the signal phase (and possibly the signal amplitude) of a point in space detected by all local antennas to be combined.

In another embodiment of the invention, spatially coded magnetic resonance signals that were received with a whole-body antenna are used to determine the weighting factors. The signals of the whole-body antenna serve as a reference for the determination of the weighting factors. The whole-body antenna has a relatively homogenous sensitivity profile due to its distance from the imaging area and its geometry.

If parts of the antenna array are unmoving during the signal acquisition—for example local antennas installed in the patient bed—these are conventionally further processed individually to achieve their good signal-to-noise ratio.

DESCRIPTION OF THE PREFERRED EMBODIMENTS

Figure 1:
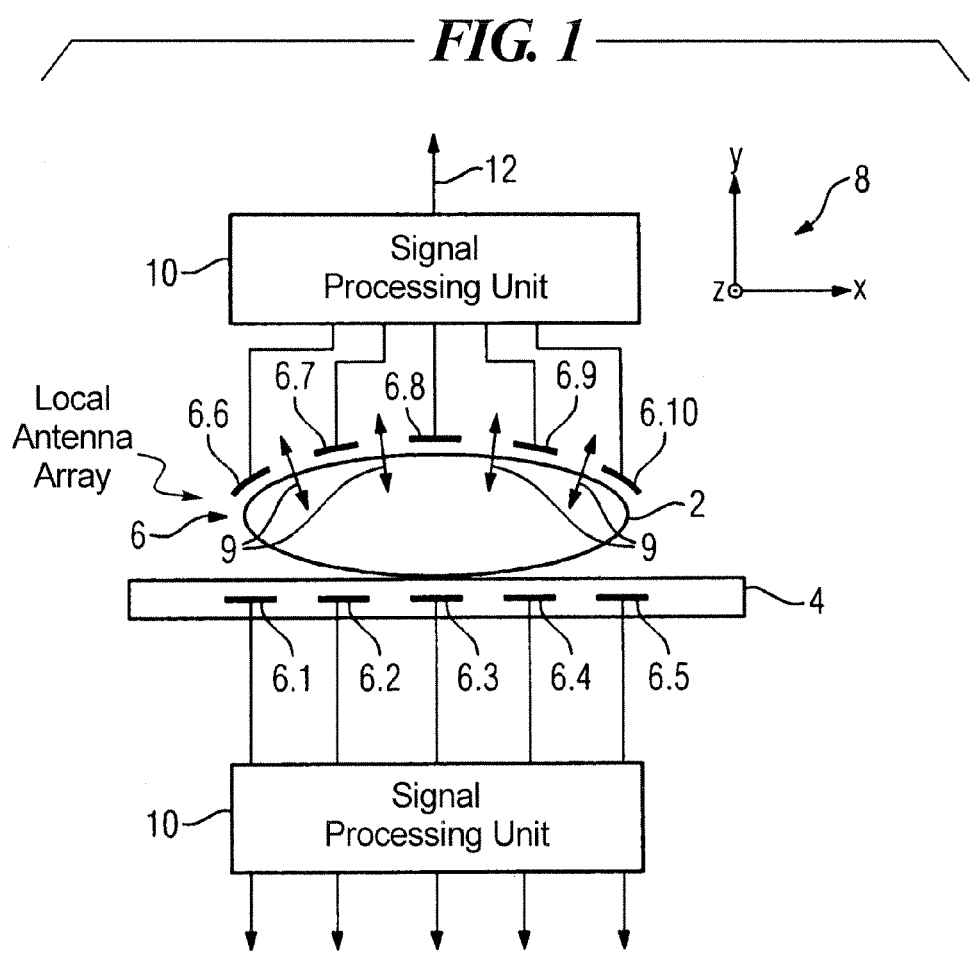
FIG. 1 schematically illustrates, in a cross section view, a patient with an applied antenna array and the signal processing unit connected with this.

As part of a diagnostic magnetic resonance apparatus, FIG. 1 schematically shows only a patient 2 on a patient bed 4 with an applied antenna array 6. The design of a magnetic resonance apparatus with the basic functional units—magnet, gradient system, controller, operating and display units—is well known to those of ordinary skill in the field, and need not be described in detail herein. To establish the alignment of an xyz coordinate system 8, the direction of the basic magnetic field generated by the magnet is designated with z (proceeding perpendicularly to the plane of the drawing), the direction transverse to the patient is designated with x, and the upward direction in FIG. 1 is designated with y. In connection with the described exemplary embodiment, it is important that the antenna array 6 has multiple individual local antennas.

Additional local antennas follow in the z-direction, such that the antenna array 6 in total covers the entire upper body of the patient 2, for example. The local antennas 6.1 through 6.5 are arranged in or also on the patient bed 4, while the local antennas 6.6 through 6.10 are supported on the upper body of the patient 2; they thus move corresponding to the breathing of the patient 2, which should be indicated by the double arrows 9.

For example, an embodiment of the antenna array comprises 4 local antennas in the patient table (spine array) and 3 rows with 6 respective local antennas on the body of the patient 2 (18 Channel Body Matrix). As an example, only 10 local antenna are shown in FIG. 1 for the sake of clarity.

The local antennas 6.1 through 6.10 are connected with a signal processing unit, which is shown separately for clarity. In the signal processing unit 10, differentiation is made between channels that are connected with unmoving local antennas and the channels connected with moving local antennas 6.1 through 6.5 or, respectively, 6.6 through 6.10. The signal processing unit 10 receives the information as to whether it is moving or unmoving from a superordinate controller, which is not shown here. The signal processing unit 10 is digitally configured and operates as controlled by programming. It is realized as part of the controller of the magnetic resonance apparatus and comprises a run-capable program whose basic structure is described in the following using FIG. 2.

According to the method that is described in more detail below, the signals of the local antennas 6.6 through 6.10 that are arranged so as to be movable are combined with weighting into a single signal 12. The signals of the local antennas that are distributed in the x-direction are respectively combined so that a number of combined magnetic resonance signals results corresponding to the number of rows in the z-direction.

It is also possible to combine only sub-groups of the coil elements 6.6 through 6.10 into a respective signal, for example 6.6, 6.8 and 6.10 into one signal and 6.7 with 6.9 into another signal. This serves to improve the capability for parallel imaging methods.

By contrast, the signals of the local antennas 6.1 through 6.5 that are arranged so as to be unmovable are respectively, individually processed further.

Figure 2:
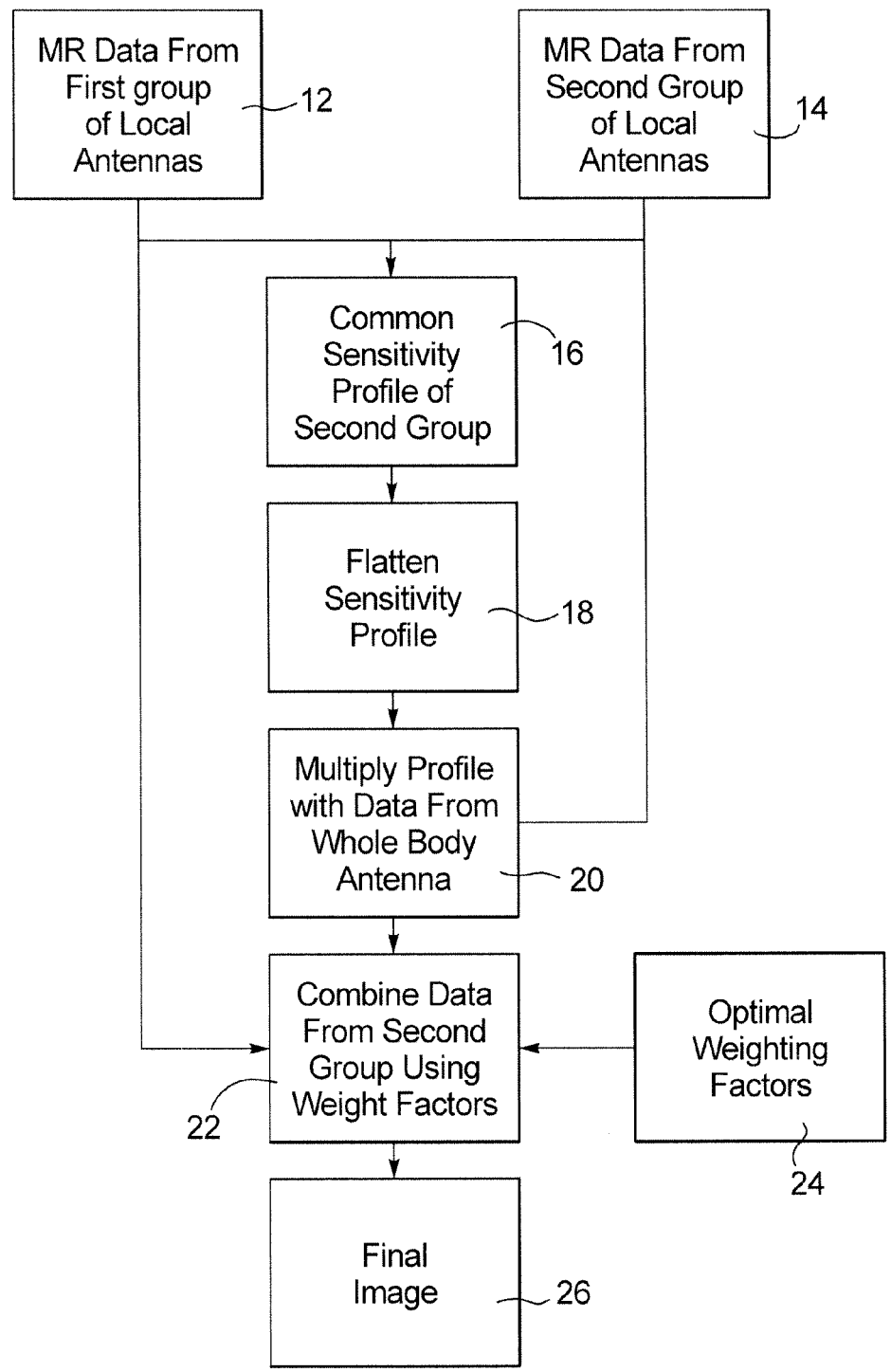
FIG. 2 is a flowchart showing the basic method steps of an exemplary embodiment of the present invention.

In a flowchart, FIG. 2 shows the basic signal processing steps of an exemplary embodiment to reduce movement artifacts in magnetic resonance images. As has already been explained above, the reception signals of the local antennas 6.6 through 6.10 that are used are combined with weighting for this purpose. A single reception antenna is therefore virtually modeled that has a reduced gradient of the sensitivity profile. Movement artifacts are thus no longer interfering. Here it is important to define the weighting factors so that the sensitivity profile of the combined local antennas has the desired curve. The weighting factors are preferably determined from an adjustment measurement or from a scout scan before the actual measurement.

The determination of the complex (in the sense of real part and imaginary part) weighting factors takes place at the image data side in the adjustment measurement, after the reconstruction from raw data (thus the received, spatially coded nuclear magnetic resonance signals). Complex image data 12 are provided have been formed (converted) from the magnetic resonance signals of the individual local antennas 6.6 through 6.10. For this purpose, magnetic resonance signals are simultaneously received from a whole-body antenna present in the magnetic resonance apparatus. Due to its geometry and also its distance from the imaging area, their sensitivity is nearly homogenous or the sensitivity profile has only a slight to negligible gradient. The magnetic resonance signals received by the whole-body antenna are likewise formed (converted) into complex image data 14.

In the signal processing step 16, the common sensitivity profile of the local antennas 6.6 through 6.10 is determined with the use of the complex image data 14. This occurs by a division operation of the (possibly filtered) image data of the combination of the local antennas 6.5 through 6.10 and the whole-body antenna.

In the next signal processing step 18, this common sensitivity profile may be flattened. This serves to provide a reasonable specification or a target value for the intensity gradient (which can be stably approximated) to the subsequent step 22. Its steepness lies between the unachievable ideal of an antenna with a homogenous sensitivity profile and that of the combination of the local coils. The flattening with an exponentiation operation with an exponent value less than 1 advantageously occurs. Other methods can also be used in order to reduce the gradient.

In method step 20, the flattened sensitivity profile is applied, by multiplication with the image data of the whole-body antenna. The sensitivity profile of the whole-body antenna is thus modified such that it can be used as an approximation target for the determination of the weighting factors.

In the signal processing step 22, the image data of the local antennas 6.6 through 6.10 are combined with weighting. The weighting factors have been modified until the combination corresponds optimally well to the flattened sensitivity profile in a predetermined region 24.

The complex weighting factors that are used in the best possible fit of the combined sensitivity profile are then used in method step 26 for a subsequent actual measurement to combine the nuclear magnetic resonance signals of the moving local antennas 6.6 through 6.10. The magnetic resonance signals received by the unmoving local antennas 6.1 through 6.5 in the actual measurement are individually processed further. The high signal-to-noise ratio of these magnetic resonance signals is therefore obtained.

Alternatively, the received magnetic resonance signals of the local antennas 6.6 through 6.10 can also be used to determine the weighting factors. For this purpose, the techniques from DE 10 2009 012 109 A1 can be used. For example, those signals of the local antennas 6.6 through 6.10 are analyzed that originate from a suitably placed region in the imaging region next to these local antennas 6.6 through 6.10. This region should deliver sufficient signal for all local antennas 6.6 through 6.10 and should be situated as centrally as possible in their imaging area. The phase position of the complex linear combination across the corresponding local antennas 6.6 through 6.10 directly results from the difference phase of the signals.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to reduce movement artifacts in a magnetic resonance (MR) image, comprising:
   operating an MR data acquisition unit to acquire MR signals from a region of a subject in the MR data acquisition unit, using a first group of individual local antennas that has a region of high sensitivity in a substantially unmoving area of said region;
   operating said MR data acquisition unit to acquire MR signals from said region of said subject in said MR data acquisition unit, using a second group of individual local antennas that has a region of high sensitivity in a moving area of said region;
   operating said MR data acquisition unit to spatially encode said MR signals received with said first group of local antennas and to spatially encode the MR signals received with said second group of local antennas;
   in a processor, processing the spatially coded MR signals received with said first group of local antennas, to produce processed signals;
   in said processor, combining the spatially coded MR signals received with said second group of local antennas with respective weightings applied by weighting factors that are determined in said processor to cause a gradient of a weighted, combined spatial dependent sensitivity of said second group of local antennas to be reduced, to produce combined signals; and in said processor, reconstructing an image of said region from said processed signals and said combined signals, and making the reconstructed image available at an output of said processor as a data file.

2. A method as claimed in claim 1 comprising operating said MR data acquisition unit to receive MR signals with a whole-body antenna of said MR data acquisition unit, and spatially encoding the MR signals received with said whole body antenna, and using the spatially coded MR signals received with the whole body antenna in said processor to determine said weighting factors.

3. A method as claimed in claim 1 comprising using the spatially coded MR signals received with said second group of local antennas to determine said weighting factors.

4. A method as claimed in claim 1 comprising determining said weighting factors using a cost function that is optimized with regard to uniform signal intensity.

5. A method as claimed in claim 4 comprising determining said weighting factors to cause a gradient of a combined sensitivity of the second group of local antennas to be optimized in order to produce an optimized gradient that is between an existing gradient of said second group of local antennas and a uniform sensitivity of said second group of local antennas.

6. A method as claimed in claim 5 comprising modeling said acceptable gradient from the spatially coded MR signals received by said second group of local antennas.

7. A method as claimed in claim 1 comprising operating said MR data acquisition unit to generate a basic magnetic field in order to acquire said MR signals with said first and second groups of local antennas, and orienting the respective individual local antennas in said first and second groups of local antennas in a direction of said basic magnetic field.

8. A magnetic resonance (MR) apparatus for reducing movement artifacts in an MR image comprising:

an MR data acquisition unit comprising a first group of individual local antennas and a second group of individual local antennas;

a control unit configured to operate said MR data acquisition unit to acquire MR signals from a region of a subject in the MR data acquisition unit, using said first group of individual local antennas arranged with a region of high sensitivity thereof in a substantially unmoving area of said region;

said control unit being configured to operate said MR data acquisition unit to acquire MR signals from said region of said subject in said MR data acquisition unit, using said second group of individual local antennas arranged with a region of high sensitivity thereof in a moving area of said region;

said control unit being configured to operate said MR data acquisition unit to spatially encode said MR signals received with said first group of local antennas and to spatially encode the MR signals received with said second group of local antennas;

a processor being configured to process the spatially coded MR signals received with said first group of local antennas, to produce processed signals;

said processor configured to combine the spatially coded MR signals received with said second group of local antennas with respective weightings applied by weighting factors that are determined in said processor to cause a gradient of a weighted, combined spatial dependent sensitivity of said second group of local antennas to be reduced, to produce combined signals; and said processor being configured to reconstruct an image of said region from said processed signals and said combined signals, and to make the reconstructed image available at an output of said processor as a data file.

* * * * *